United States Patent [19]
Okamoto et al.

[11] Patent Number: 5,920,105
[45] Date of Patent: Jul. 6, 1999

[54] COMPOUND SEMICONDUCTOR FIELD EFFECT TRANSISTOR HAVING AN AMORPHOUS GAS GATE INSULATION LAYER

[75] Inventors: Naoya Okamoto; Hitoshi Tanaka; Naoki Hara, all of Kanagawa, Japan

[73] Assignee: Fujitsu Limited, Kawasaki, Japan

[21] Appl. No.: 09/016,419

[22] Filed: Jan. 30, 1998

Related U.S. Application Data

[63] Continuation-in-part of application No. 08/818,594, Mar. 18, 1997, abandoned.

[30] Foreign Application Priority Data

Sep. 19, 1996 [JP] Japan ................................. 8-248170
Jun. 30, 1997 [JP] Japan ................................. 9-175052
Aug. 28, 1997 [JP] Japan ................................. 9-232710

[51] Int. Cl.$^6$ ................................................. H01L 29/78
[52] U.S. Cl. ...................... 257/410; 257/288; 257/289; 257/290; 257/368; 257/411
[58] Field of Search ................................. 257/218–220, 257/256–262, 268, 282, 288–290, 368, 410, 411, 629–652

[56] References Cited

U.S. PATENT DOCUMENTS 5,760,462  6/1998  Barron et al. ........................ 257/410

*Primary Examiner*—Fetsum Abraham
*Attorney, Agent, or Firm*—Armstrong, Westerman, Hattori, McLeland & Naughton

[57] ABSTRACT

An undoped GaAs layer and a GaAs active layer are formed on a GaAs semiconductor substrate in that order, and a surface of the GaAs active layer is inactivated. Thereafter, a wafer composed of the GaAs semiconductor substrate, the undoped GaAs layer and the GaAs active layer is annealed at temperatures ranging from 570 to 580° C. in a molecular beam epitaxy apparatus. Thereafter, the wafer is maintained at temperatures ranging from 350 to 500° C., and an insulating layer made of amorphous GaAs is formed on the GaAs active layer while using tertiary-butyl-gallium-sulfide-cubane "$((t-Bu)GaS)_4$" as a source of the insulating layer. Thereafter, the insulating layer is patterned according to a photo-lithography method to form a gate insulating layer on the GaAs active layer. Thereafter, a source electrode and a drain electrode are formed on both sides of the gate insulating layer to arrange the source and drain electrodes separated from each other on the GaAs active layer, and a gate electrode is formed on the gate insulating layer.

8 Claims, 13 Drawing Sheets

16: LIQUID NITROGEN TRAP

COMPOUND SEMICONDUCTOR FIELD EFFECT TRANSISTOR HAVING AN AMORPHOUS GAS GATE INSULATION LAYER

This application is a continuation-in-part of application Ser. No. 08/818,594, filed Mar. 18, 1997, which is now abandoned.

BACKGROUND OF THE INVENTION

1. Field of the Invention

The present invention relates to a compound semiconductor apparatus and a method for manufacturing the apparatus in which a compound semiconductor layer, a gate insulating layer and a gate electrode are arranged in that order.

2. Description of the Prior Art

A metal-semiconductor field effect transistor (MESFET) and a high electron mobility transistor (HEMT), in which a gallium-arsenic (GaAs) compound semiconductor is used, has been recently watched as a very high speed device. The GaAs-MESFET is currently used for a mobile communication device such as a portable telephone, and the HEMT is currently used for a satellite broadcasting receiving antenna.

Also, a GaAs metal-insulator semiconductor (MIS) FET has been recently watched as a low consumed electric power and high output type compound semiconductor device.

FIG. 1 is a cross sectional view showing a configuration of a conventional GaAs MISFET.

As shown in FIG. 1, an undoped GaAs buffer layer 32 is arranged on a GaAs semiconductor substrate 31, and a GaAs active layer 33 in which an n-type impurity is doped is arranged on the GaAs buffer layer 32. Also, a source electrode 34a and a drain electrode 34b separated from each other are arranged on the GaAs active layer 33, a gate insulating layer 35 placed between the source electrode 34a and the drain electrode 34b is arranged on the GaAs active layer 33, and a gate electrode 36 is arranged on the gate insulating layer 35.

In a prior art, $SiO_2$ or $Al_2O_3$ is used as a material of the gate insulating layer 35. However, when the gate insulating layer 35 is made of $SiO_2$ or $Al_2O_3$, a large number of interface state for electrons and holes are generated in an interface between the gate insulating layer 35 and the GaAs active layer 33. Therefore, there is a drawback that a desired electric characteristic is not obtained in the conventional GaAs MISFET.

To solve this drawback, another prior art in which tertiary-butyl-gallium-sulfide-cubane "$((t-Bu)GaS)_4$," is used as a source of a gate insulating layer and a GaS insulating layer having a cubic structure, in which a composition ratio of Ga to S is 1:1, is formed by a metal organic chemical vapor deposition (MOCVD) is proposed in a plurality of literatures "A. N. MacInnes et. al., Chem. Mater., 4, 11(1992)", "A. N. MacInnes et. al., Appl. Phys. Lett., 62, 711(1993)", "M. Tabib-Azar et. al., Appl. Phys. Lett., 63, 625(1993)", and "P. P. Jenkins et. al., Science, 263, 1751(1994)".

In this method disclosed in the above literatures, when a GaS insulating layer is formed on a GaAs layer, a substrate is heated to a temperature ranging from about 400 to 450° C., and GaS is epitaxially grown on the GaAs layer. Because a lattice constant of GaS crystal is close to a lattice constant of GaAs crystal, the number of interface state generated in an interface between the GaAs layer and the GaS layer is considerably decreased. Because the number of interface state is decreased, a non-radiative surface recombination is suppressed, so that a photo luminescence (PL) intensity of GaAs layer with contacting GaS layer is larger than a PL intensity of GaAs layer without contacting GaS layer.

However, though a lattice constant of a normal GaS crystal is 5.4 Å, a lattice constant of the GaS crystal epitaxially grown on the GaAs layer is increased to 5.63 Å. That is, the GaS layer and GaAs layer is distorted when the GaS layer is epitaxially grown on the GaAs layer, so that the reduction of the number of interface state is not sufficient in the method disclosed in the above literatures.

Also, in cases where InGaAs is used as a source of the compound semiconductor layer, when a GaS insulating layer is formed on an InGaAs layer by the method disclosed in the above literatures, because a lattice constant of InGaAs crystal is larger than that of GaAs crystal, there is a probability that an interface between the compound semiconductor layer (or the InGaAs layer) and the GaS insulating layer is moreover distorted or a dislocation occurs in the InGaAs layer. Therefore, in cases where the compound semiconductor layer is made of a source other than GaAs, it is not adequate to apply the method disclosed in the above literatures to the formation of the GaS insulating layer.

In addition, in cases where the GaS insulating layer is formed by the MOCVD method, when a substrate temperature reaches 450° C. or more, sulfur (S) atoms existing in the GaS insulating layer are liberated from a GaS structure of the GaS insulating layer, and a composition ratio of Ga to S in the GaS insulating layer is changed. Therefore, it is difficult that the GaS insulating layer has a stable electric characteristic.

SUMMARY OF THE INVENTION

An object of the present invention is to provide, with due consideration to the drawbacks of such a conventional MIS field effect transistor and a conventional method for manufacturing the MIS field effect transistor, a MIS field effect transistor in which the number of interface state existing in an interface between a compound semiconductor layer and a GaS insulating layer is extremely low, a material of the compound semiconductor layer is selected from the group consisting of GaAs, InGaAs and the like and an electric characteristic is superior. Also, the object of the present invention is to provide a method for manufacturing the MIS field effect transistor.

In a MIS field effect transistor according to the present invention, a gate insulating layer is formed out of amorphous GaS. Because GaS forming the gate insulating layer is not crystallized, the gate insulating layer does not influence on a lattice constant of a crystal material forming a compound semiconductor layer as a ground layer. Therefore, the occurrence of a distortion in the gate insulating layer can be prevented, and the gate insulating layer having a high quality can be obtained.

Also, in a manufacturing method according to the present invention, a molecular beam epitaxy (MBE) apparatus is used, a substrate temperature is maintained within a range from 400 to 500° C., and the gate insulating layer formed out of amorphous GaS is formed on the compound semiconductor layer. In this case, because the gate insulating layer does not influence on a lattice constant of a crystal material forming the compound semiconductor layer as a ground layer, the number of interface state existing in an interface between the compound semiconductor layer and the GaS insulating layer is moreover decreased as compared with that in a MIS field effect transistor in which a gate insulating layer is formed out of GaS crystal.

Therefore, a MIS field effect transistor having a high performance can be manufactured. Also, even though the compound semiconductor layer is formed out of a material other than GaAs, the manufacturing method according to the present invention can be applied to manufacture a MIS field effect transistor according to the present invention.

DESCRIPTION OF THE PREFERRED EMBODIMENTS

Preferred embodiments of a compound semiconductor apparatus and a method for manufacturing the compound semiconductor apparatus according to the present invention are described with reference to drawings.

First Embodiment

Figure 2:
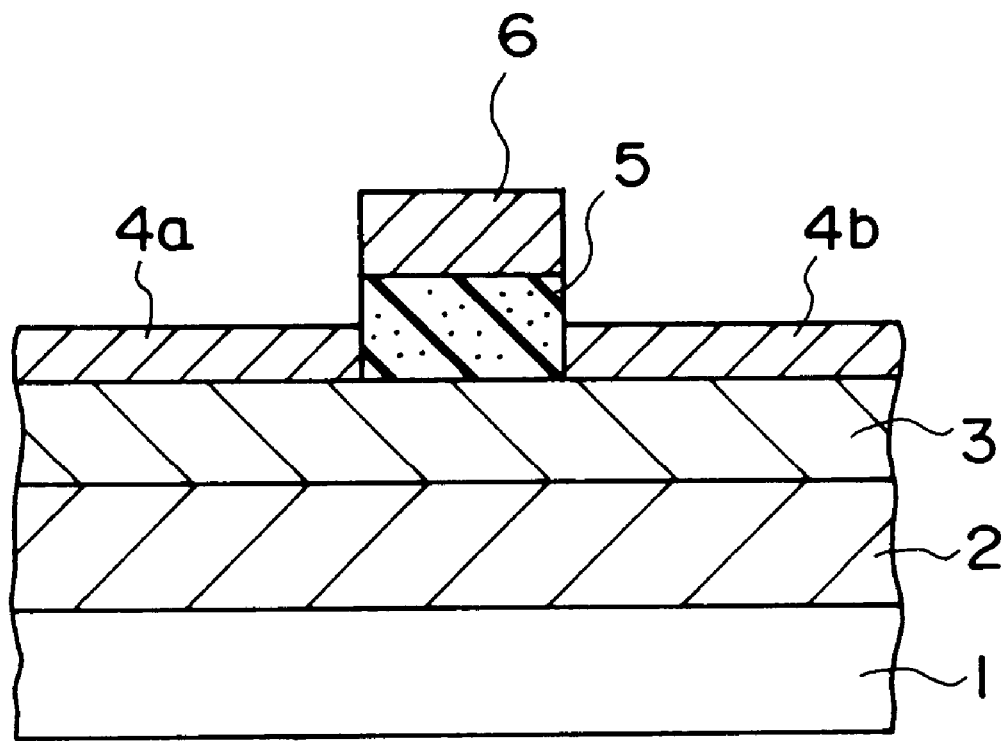
FIG. 2 is a cross sectional view showing a configuration of a MISFET according to the first embodiment of the present invention.

FIG. 2 is a cross sectional view showing a configuration of a MISFET according to the first embodiment of the present invention.

As shown in FIG. 2, an undoped GaAs buffer layer 2 is arranged on a GaAs semiconductor substrate 1, and a GaAs active layer 3 in which an n-type impurity is doped in GaAs is arranged on the undoped GaAs buffer layer 2. Also, a source electrode 4a and a drain electrode 4b separated from each other are arranged on the GaAs active layer 3, a gate insulating layer 5 placed between the source electrode 4a and the drain electrode 4b is arranged on the GaAs active layer 3, and a gate electrode 6 is arranged on the gate insulating layer 5. The gate insulating layer 5 is formed out of amorphous GaS.

Figure 1:
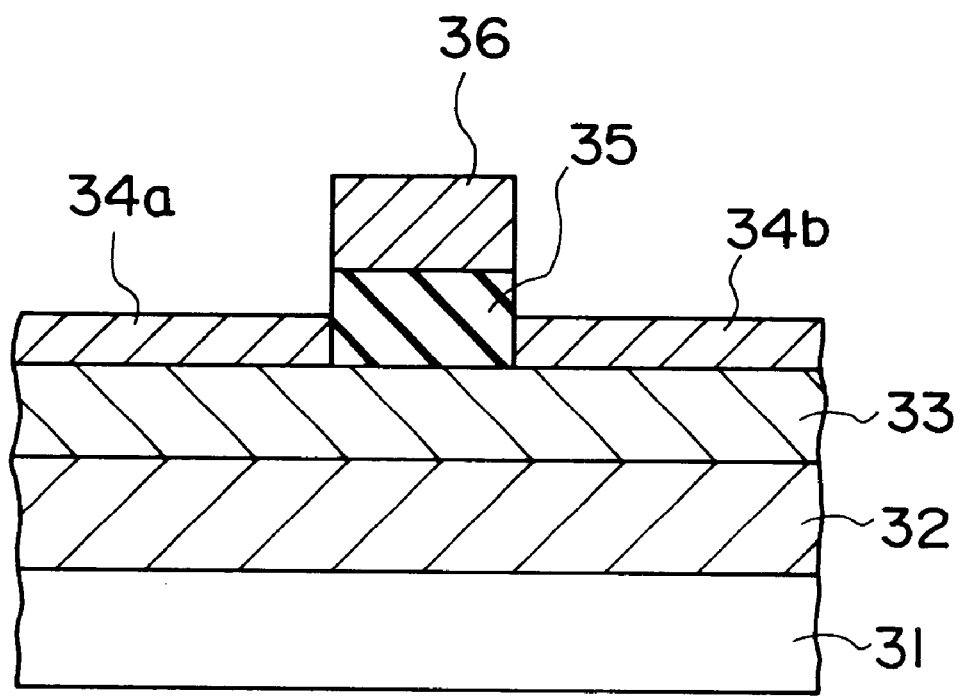
FIG. 1 is a cross sectional view showing a configuration of a conventional GaAs MISFET.
Figure 3:
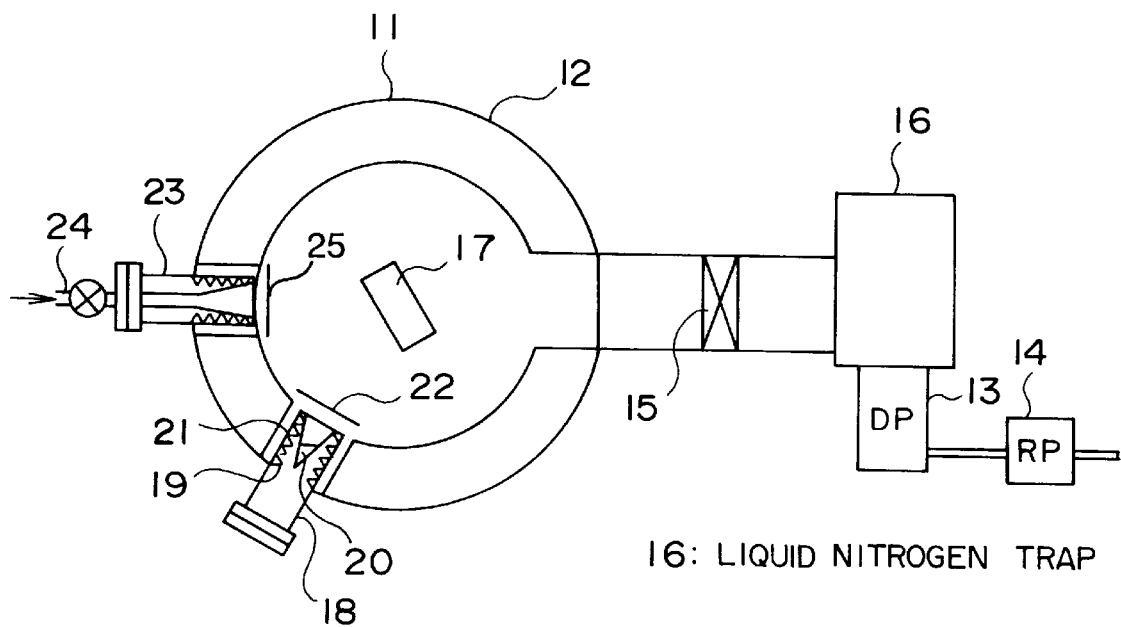
FIG. 3 is a schematic view of an MBE apparatus used for a MISFET manufacturing method according to the embodiment of the present invention.

FIG. 3 is a schematic view of an MEE apparatus used for the gate insulating layer 5 manufacturing. The MBE apparatus shown in FIG. 3 is the same as that used to manufacture the conventional MISFET shown in FIG. 1.

As shown in FIG. 3, a vacuum chamber 11 is connected with a diffusion pump 13 and a rotary pump 14 to set the vacuum chamber 11 to a high vacuum condition. A gate valve 15 and a liquid nitrogen trap 16 are arranged between the vacuum chamber 11 and the diffusion pump 13. A liquid nitrogen shroud 12 is arranged in the vacuum chamber 11. When liquid nitrogen is put in the liquid nitrogen shroud 12, impurity components produced in a PBN crucible 21 are captured in the liquid nitrogen shroud 12. However, because the PBN crucible 21 is set to a low temperature in this embodiment when the gate insulating layer 5 is formed, it is not required to put liquid nitrogen in the liquid nitrogen shroud 12. Therefore, it is not necessarily required to provide the liquid nitrogen shroud 12 for the MBE apparatus.

Also, a substrate mounting element 17 is arranged in the vacuum chamber 11, and the GaAs semiconductor substrate 1 is put on the substrate mounting element 17. The GaAs semiconductor substrate 1 is rotated by a substrate rotating mechanism (not shown) arranged in the substrate mounting element 17 and is heated by a heating mechanism (not shown) arranged in the substrate mounting element 17.

Also, a knudsen cell (K cell) 18 is stuck in the vacuum chamber 11. In the K cell 18, the PBN crucible 21 and a heater 19 are arranged. A source of the gate insulating layer 5 is put in the PBN crucible 21, and the source is heated and vaporized by the heater 19. Also, a shutter 22 is arranged on the front of the K cell 18. Therefore, when the K cell 18 is closed by the shutter 22, even though the source of the gate insulating layer 5 is vaporized, the material cannot be deposited on the GaAs semiconductor substrate 1 placed in the vacuum chamber 11.

Also a gas cell 23 is stuck in the vacuum chamber 11. A pipe 24 is connected in the gas cell 23. A tris dimethyl amino arsine (hereinafter, called TDMAAs) is supply in the vacuum chamber 11 trough the pipe 24 and gas cell 23. Also, a shutter 25 is arranged on the front of the gas cell 23.

Hereinafter, a method for manufacturing a MISFET while using the MBE apparatus is described.

Figure 4A:
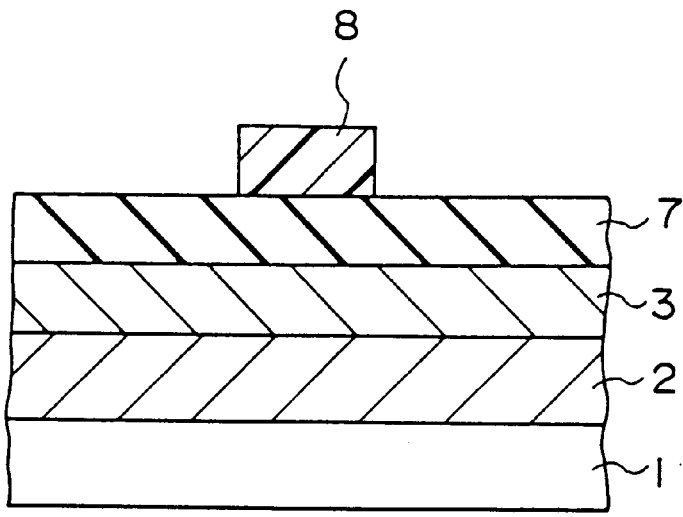
FIGS. 4(A) to 4(C) are cross sectional views showing a series of manufacturing steps of the MISFET manufacturing method.
Figure 4B:
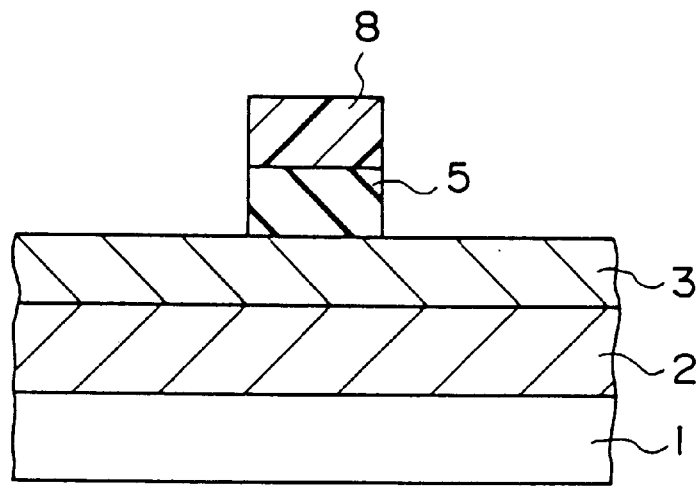
Figure 4C:
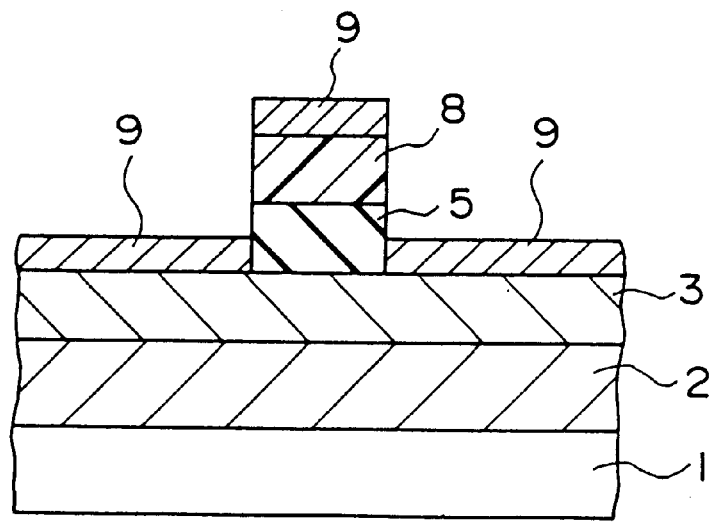

FIGS. 4(A) to 4(C) are cross sectional views showing a series of manufacturing steps of the MISFET manufacturing method.

As shown in FIG. 4(A), after the GaAs semiconductor substrate 1 is arranged in a vacuum chamber of a MBE apparatus to forming a GaAs buffer layer and a GaAs active layer, a material of the undoped GaAs buffer layer 2 is vaporized in the PBN crucible, the undoped GaAs buffer layer 2 is formed on the GaAs semiconductor substrate 1 at a thickness of about 500 nm, and the n-type GaAs active layer 3 is epitaxially grown on the undoped GaAs buffer layer 2 at a thickness of about 200 nm. The n-type GaAs active layer 3 functions as a device region, and a concentration of the n-type impurity in the GaAs active layer 3 is, for example, $3 \times 10^{17}$ $cm^{-3}$.

Thereafter, a wafer composed of the GaAs semiconductor substrate 1, the undoped GaAs buffer layer 2 and the GaAs active layer 3 is taken out from the vacuum chamber of the MBE apparatus, a surface of the GaAs active layer 3 makes contact with an ammonium sulfide "$(NH_4)_2S_x$" solution set at a temperature of 55° C. for about 30 minutes, and a inactivating processing is performed for the surface of the GaAs active layer 3. Therefore, the surface of the GaAs active layer 3 is inactivated.

Thereafter, the wafer is set on the substrate mounting element 17 of the vacuum chamber 11 of the MBE apparatus, shown in FIG. 3, the vacuum chamber 11 is set to a high vacuum condition of $10^{-9}$ Torr or less, and the wafer is annealed. That is, the wafer is heated in a range from 570 to 580° C. and is maintained for 10 minutes.

Thereafter, the wafer is heated to 450° C. Also, a precursor ((t-Bu)GaS) 4 is set in the PBN crucible 21 as a source of the gate insulating layer 5, the K cell 18 is heated to 50° C. by the heater 19, the shutter 22 is opened, an amorphous GaS layer 7 made of the tertiarybutyl-gallium-sulfide-cubane "$((t-Bu)GaS)_4$" is deposited on the GaAs active layer 3 at a thickness of 30 nm. Thereafter, a photoresist is coated on the amorphous GaS layer 7 to form a photoresist film 8, the photoresist film 8 is patterned, and a pair of portions of the amorphous GaS layer 7 placed in a pair of electrode regions, in which the source electrode 4a and the drain electrode 4b are planned to be formed, are exposed.

Thereafter, as shown in FIG. 4(B), the exposed portions of amorphous GaS layer 7 are etched by hydrochloric acid (HCl) while using the patterned photoresist film 8 as a mask, so that the gate insulating layer 5 is formed.

Thereafter, as shown in FIG. 4(C), the source electrode 4a and the drain electrode 4b ohmic-connected with the GaAs active layer 3 are formed by a lift-off method. That is, a conductive film 9 composed of an Ni layer and an AuGe layer is deposited over the entire surface of the GaAs active layer 3 and the patterned photoresist film 8 by using a vacuum evaporator apparatus, and the patterned photoresist film 8 and a portion of the conductive film 9 arranged on the patterned photoresist film 8 are removed. Therefore, the remaining portions of the conductive film 9 are used as the source electrode 4a and the drain electrode 4b.

Thereafter, a Ti layer and an Au layer is formed on the gate insulating layer 5 one after another by using a photo-lithography technique, so that the gate electrode 6 is formed on the gate insulating layer 5. Therefore, the MISFET shown in FIG. 2 is manufactured.

Accordingly, because the gate insulating layer 5 is formed out of the amorphous GaS, any influence of a crystal structure of the GaAs active layer 3 is not exerted on the gate insulating layer 5, so that any distortion does not occur in the gate insulating layer 5. Therefore, the number of interface state generated in an interface between the GaAs active layer 3 and the gate insulating layer 5 can be considerably decreased, so that a MISFET having a superior electric characteristic can be manufactured.

Also, there is no probability that sulfur (S) atoms existing in the amorphous GaS layer 7 are liberated from the amorphous GaS when the gate insulating layer 5 is formed, so that a composition ratio of Ga to S in the gate insulating layer 5 can be reliably maintained to 1:1.

Also, because the K cell 18 is heated to only 50° C. when the amorphous GaS layer 7 is deposited on the GaAs active layer 3, a heating temperature in the K cell 18 is low, so that there is no probability that an impurity component is vaporized from the PBN crucible 21 and is deposited on the GaAs active layer 3. Therefore, it is not required to provide liquid nitrogen for the liquid nitrogen shroud 12. That is, it is not required to arrange the liquid nitrogen shroud 12 in the MBE apparatus, so that a configuration of the MBE apparatus can be simplified.

Next, an examined result of a structure of a GaS layer which is formed on a GaAs semiconductor substrate is described. The GaAs semiconductor substrate corresponds to the GaAs active layer 3 of the embodiment, and the GaS layer corresponds to the gate insulating layer 5 (or the amorphous GaS layer 7) of the embodiment.

Figure 5:
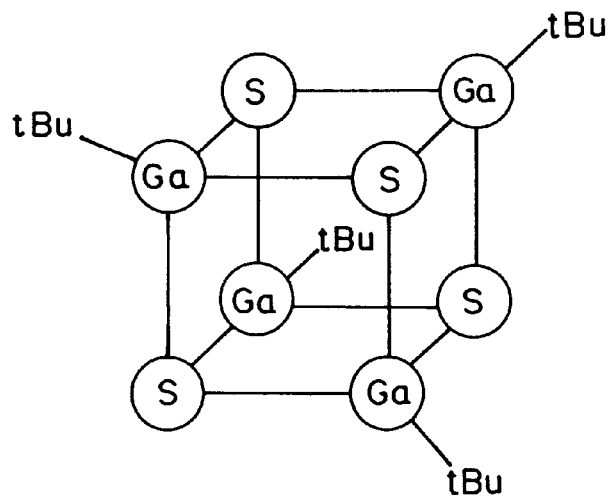
FIG. 5 shows a molecular structure of tertiary-butylgallium-sulfide-cubane "$((t\text{-Bu})GaS)_4$".

An undoped GaAs semiconductor substrate (hereinafter, called an S processed substrate) of which a surface is inactivated by the ammonium sulfide "$(NH_4)_2S_x$" solution is prepared as a first substrate, and another undoped GaAs semiconductor substrate (hereinafter, called a thermal processed substrate) which is not inactivated but is thermally processed in a vacuum condition to remove an oxide film from the thermal processed substrate is prepared as a second substrate. Thereafter, the S processed substrate and the thermal processed substrate are set on the substrate mounting element 17 of the MBE apparatus shown in FIG. 3, and the vacuum chamber is set to a high vacuum condition. Also, $((t-Bu)GaS)_4$ is put in the PBN crucible 21 as a source of a gate insulating layer. A molecular structure of "$((t-Bu)GaS)_4$" is shown in FIG. 5. As shown in FIG. 5, "$((t-Bu)GaS)_4$" has a cluster structure composed of gallium (Ga) atoms and sulfur (S) atoms. In this experiment, any liquid nitrogen is not put in the liquid nitrogen shroud 12.

Thereafter, the S processed substrate and the thermal processed substrate are heated in a range from 570 to 580° C. and is maintained for 10 minutes, so that the S processed substrate and the thermal processed substrate are annealed. Thereafter, the S processed substrate and the thermal processed substrate are set to a temperature ranging from 400 to 500° C., a temperature of the K cell 18 is maintained to 50° C., a pressure of the vacuum chamber 11 is set in the order of $10^{-6}$ Torr, the shutter 22 is opened, and GaS is deposited on a surface of the S processed substrate and a surface of the thermal processed substrate. Therefore, a GaS layer having a thickness of about 100 nm is formed on the S processed substrate and the thermal processed substrate. In this case, a depositing speed of GaS ranges from 36 to 120 nm/h.

Thereafter, an X-ray diffraction figure of the GaS layer arranged on each of the processed substrates is measured by using a high resolution X-ray diffraction fourfold crystal X-ray diffraction) apparatus. As a result of the X-ray diffraction measurement, any diffraction peak of GaS layer is not observed. Therefore, it is ascertained that a structure of the GaS layer formed on each of the processed substrates by a vacuum deposition method is set in an amorphous condition.

Thereafter, a composition analysis for the GaS layer is performed by performing a channeling measurement of a Rutherford back-scattering method, and crystallinity of the GaS layer is estimated. In detail, as a first example, the GaS layer is formed on condition that each of the processed substrates are set to a temperature of 400° C. when the GaS is deposited. Also, as a second example, the GaS layer is formed on condition that each of the processed substrates are set to a temperature of 500° C. when the GaS is deposited. Thereafter, the composition of the GaS layer for each example and each processed substrate is analyzed. As a result, it is ascertained that a composition ratio of Ga to S in the GaS layer is 1:1 for each example and each processed substrate. Also, it is ascertained that any of the GaS layers corresponding to the examples and the processed substrates is not a single crystal. Therefore, it is ascertained in the same manner as in the X-ray diffraction measurement that a structure of each GaS layer is an amorphous.

In the above literatures of the prior art, it is disclosed that sulfur atoms are liberated from a GaS structure of a GaS layer when the GaS layer is formed by the MOCVD method on condition that a substrate temperature is set to 450° C. or more. However, in this embodiment, The GaS layer by the vacuum deposition method using the MBE apparatus, even though each processed substrate is set to a temperature of 500° C., a composition ratio of Ga to S in the GaS layer can be stably set to 1:1.

Next, the decrease of the number of interface state existing in an interface between each processed substrate and the GaS layer is described with reference to FIG. 6.

Figure 6:
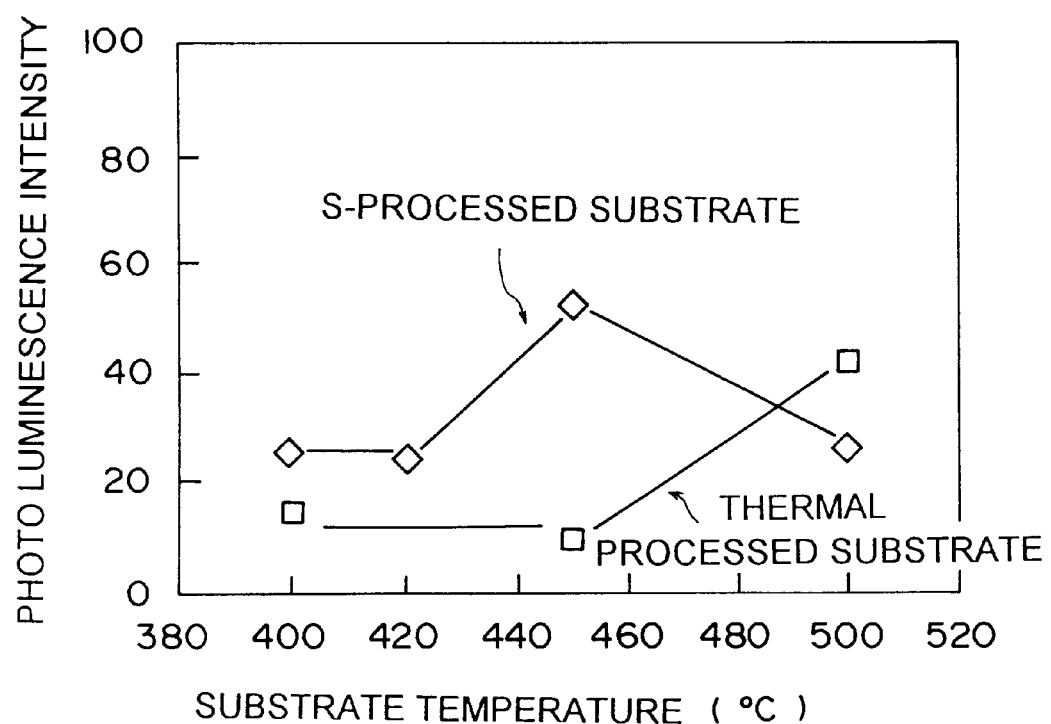
FIG. 6 shows a relationship between a photo luminescence (PL) intensity ratio of a GaAs semiconductor substrate with contacting GaS layer according to the embodiment of the present invention and a substrate temperature.

FIG. 6 shows a relationship between a photo luminescence (PL) intensity ratio of the GaAs substrate with contacting the GaS and a substrate temperature.

As shown in FIG. 6, a PL intensity ratio of the GaAs substrate with contacting the GaS is measured for each processed substrate while changing the substrate temperature. In case of the S processed substrate, when the substrate temperature is 450° C., the PL intensity ratio is maximized to 52.5. Also, in case of the thermal processed substrate, when the substrate temperature is 500° C., the PL intensity ratio is maximized to 42.5 and is comparatively large.

Therefore, even though the GaS layer is formed on a compound semiconductor substrate by the vacuum deposition method using the MBE apparatus, it is apparent that a passivation effect in which the number of interface state existing in an interface between each processed substrate and the GaS layer is decreased can be obtained.

A measuring result is described to clarify the passivation effect caused by the GaS layer. In this measurement, a GaS layer is formed on an undoped GaAs semiconductor substrate, and a change of a PL intensity of an interface between the semiconductor substrate and the GaS layer is measured over a one-year period.

As a substrate, a S processed substrate, a thermal processed substrate and a substrate in which an oxide film of a surface is not removed (hereinafter, called an non-processed substrate) are prepared. Thereafter, the MBE apparatus described above is used, these substrates are respectively heated to a temperature of 400° C., and an amorphous GaS layer is formed on each of the substrates. A GaS layer is formed on a GaAs substrate by depositing a GaS on the surface thereof, there the GaS layer on the surface is removed by an etching process (hereinafter, called an etching substrate). Thereafter, a PL intensity of a surface of each of the substrates is measured. That is, a ratio of a PL intensity of the S processed substrate to a PL intensity of the non-processed substrate, a ratio of a PL intensity of the thermal processed substrate to the PL intensity of the non-processed substrate and a ratio of a PL intensity of the etching substrate to the PL intensity of the non-processed substrate are measured as a measured result.

Figure 7:
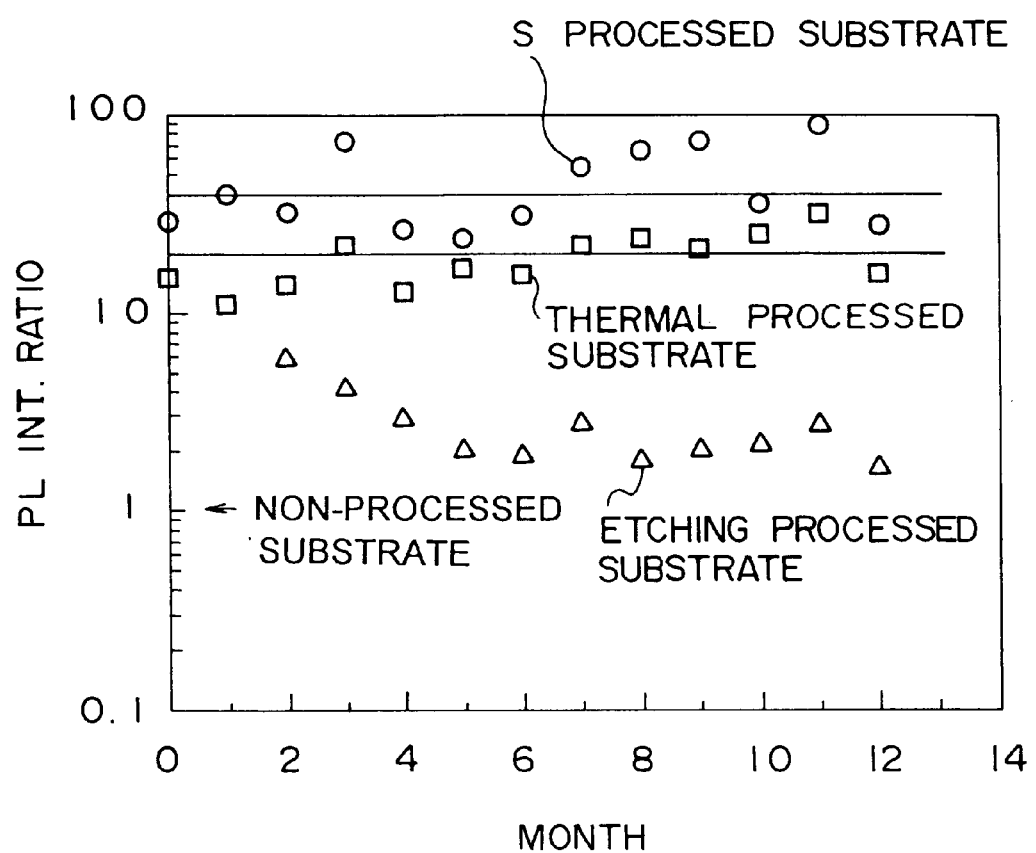
FIG. 7 shows a PL intensity ratio of a S processed substrate to an non-processed substrate, a PL intensity ratio of a thermal processed substrate to the non-processed substrate and a PL intensity ratio of an etching substrate measured to the non-processed substrate measured over a one-year period.

In FIG. 7, the PL intensity ratios of the S processed substrate, the PL intensity ratios of the thermal processed substrate and the PL intensity ratios of the etching substrate measured over an one-year period are shown. As shown in FIG. 7, the PL intensity of the S processed substrate is about 30 times as high as that of the non-processed substrate, the PL intensity of the thermal processed substrate is about 15 times as high as that of the non-processed substrate, and the PL intensity of the S processed substrate and the PL intensity of the thermal processed substrate are stable over a one-year period. The PL intensity of the etching substrate is gradually decreased over a one-year period. Therefore, it is realized that the amorphous GaS layer formed by the MBE apparatus is superior as a passivation film of the semiconductor apparatus.

Next, an experimental result of an interface state density at an interface between a GaAs semiconductor substrate and an amorphous GaS layer is described.

A GaAs semiconductor substrate in which a concentration of an n-type impurity is $3\times10^{17}$ cm$^{-2}$ is prepared, and the GaAs semiconductor substrate is thermally processed without As. In this case, the substrate is set to a temperature of 575° C. and is maintained for 10 minutes. Thereafter, the substrate is set to a temperature of 400° C. and an amorphous GaS layer having a thickness of 86 nm is formed on the GaAs semiconductor substrate by using the MBE apparatus described above. Thereafter, an electrode made of aluminum is formed on the amorphous GaS layer, so that a sample is obtained. Thereafter, an interface state density at the interface between the GaAs semiconductor substrate and the amorphous GaS layer is measured by using a Terman's method generally used as a measuring method of an interface state density.

Figure 8:
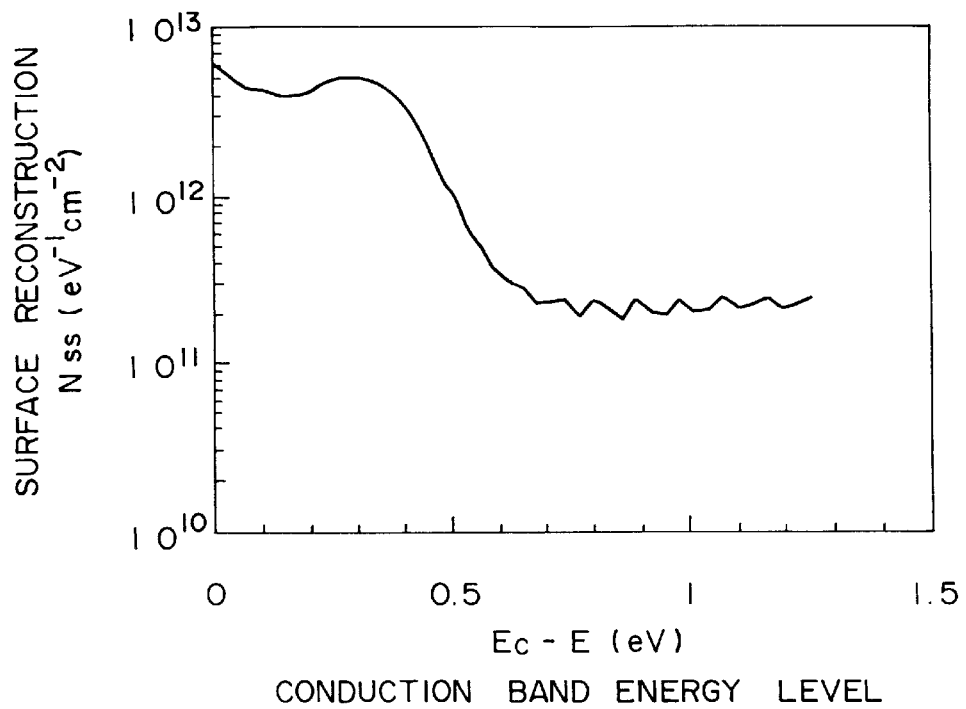
FIG. 8 shows a distribution of interface states density at an interface between a GaAs semiconductor substrate processed by thermal cleaning without As and an amorphous GaS layer.

FIG. 8 shows a distribution of interface states density at the interface between the GaAs semiconductor substrate and the amorphous GaS layer. In FIG. 8, an X-axis indicates a conduction band energy level, and a Y-axis indicates an interface state density. As shown in FIG. 8, a minimum value of the interface state density in the neighborhood of a mid-gap in the GaAs semiconductor substrate is $2\times10^{11}$ eV$^{-1}$cm$^{-2}$.

Also, the sample is analyzed according to a secondary ion mass spectroscopy (hereinafter, called SIMS), and it is realized that a large volume of oxygen and carbon exist in the interface between the GaAs semiconductor substrate and the amorphous GaS layer as an interface impurity. Therefore, in cases where a concentration of the interface impurity is reduced, the interface state density can be moreover lowered.

Thereafter, an oxide film arranged on a surface of the GaAs semiconductor substrate is removed by TDMAAs to reduce the concentration of the interface impurity. The oxide film arranged on the surface of the GaAs semiconductor substrate can be removed by the TDMAAs even though the GaAs semiconductor substrate is set to a low temperature.

In detail, an n-type GaAs epitaxial layer having an impurity concentration of $1\times10^{17}$ cm$^{-3}$ is initially formed on a semiconductor substrate by the MOCVD method. Thereafter, the semiconductor substrate is heated to 500° C. in the chamber 11 of the MBE apparatus shown in FIG. 3 while flowing the TDMAAs at a flow rate of 0.5 sccm, and the semiconductor substrate is held in the chamber 11 for 15 minutes to form a TDMAAs-processed semiconductor substrate. That is, an oxide film arranged on a surface of the GaAs epitaxial layer is removed by the TDMAAs. Thereafter, the TDMAAs-processed semiconductor substrate is heated to 420° C. and an amorphous GaS layer is formed on the substrate, and an electrode made of aluminum is formed on the amorphous GaS layer, so that a first sample relating to the TDMAAs-processed semiconductor substrate is obtained. Thereafter, this first sample is analyzed according to the SIMS. In this analysis, it is realized that an amount of oxygen and carbon existing in an interface between the TDMAAs-processed semiconductor substrate and the amorphous GaS layer is considerably reduced as compared with that existing in the interface between the thermal processed semiconductor substrate and the amorphous GaS layer.

In another case, an n-type GaAs epitaxial layer having an impurity concentration of $1 \times 10^{17}$ cm$^{-3}$ is initially formed on a semiconductor substrate by the MOCVD method in the same manner, and an oxide film arranged on a surface of the GaAs epitaxial layer is removed by the TDMAAs in the chamber 11 while flowing the TDMAAs in the same manner, so that a TDMAAs-processed semiconductor substrate is obtained. Thereafter, a temperature of the TDMAAs-processed semiconductor substrate is decreased to 420° C. while flowing the TDMAAs in the chamber 11, so that a surface structure of the surface of the GaAs epitaxial layer is reconstructed to a C (4×4) structure. Thereafter, a GaS layer is formed on the GaAs epitaxial layer, and an electrode made of aluminum is formed on the amorphous GaS layer, so that a second sample relating to the TDMAAs-processed semiconductor substrate is obtained.

Figure 9:
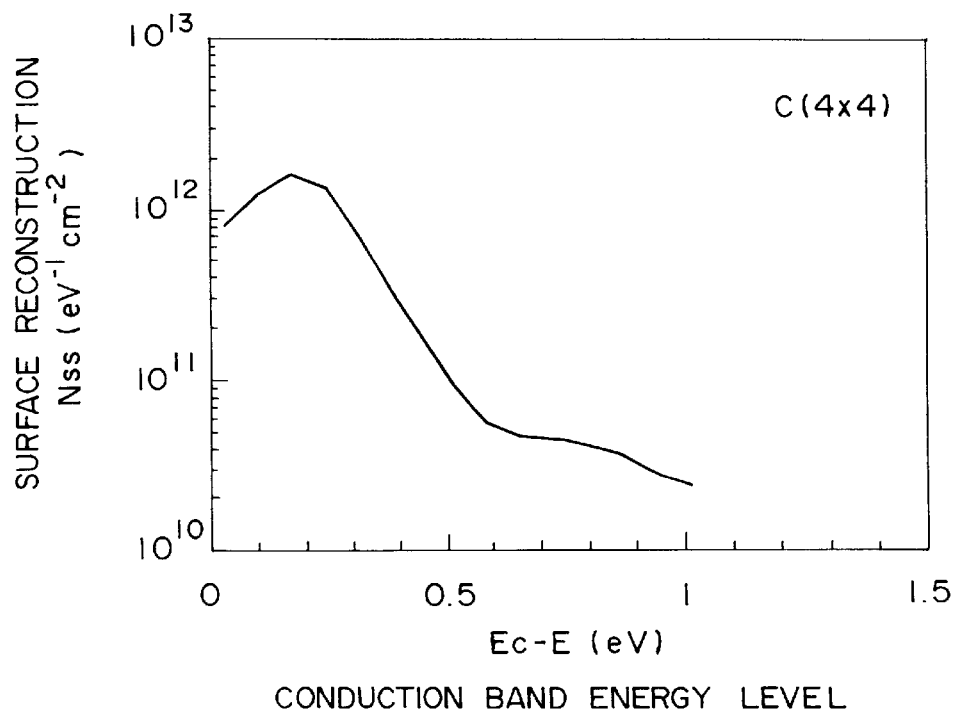
FIG. 9 shows a distribution of an interface state density, which is examined by a Terman's method, in a GaAs semiconductor substrate processed by tris dimethyl amino arsine.

Thereafter, an interface state density of the second sample is examined by the Terman's method. A distribution of the interface state density is shown in FIG. 9. As shown in FIG. 9, an interface state density of the second sample in the neighborhood of a mid-gap of the GaAs epitaxial layer is $5 \times 10^{10}$ eV$^{-1}$cm$^{-2}$, so that the interface state density of the second sample is considerably reduced as compared with that of the thermal processed semiconductor substrate. For example, it is written in the literature "M. Tabib-Azar et. al., Appl. Phys. Lett., 63, 625(1993)" that an interface state density in the neighborhood of a mid-gap of a GaAs layer is $9 \times 10^{10}$ eV$^{-1}$cm$^{-2}$.

Accordingly, the amorphous GaS layer formed according to the present invention is superior as an gate insulating layer of the MISFET to the GaS layer written in the above literature.

In the above embodiment, the gate insulating layer 5 (or the GaS layer) is arranged on a compound semiconductor represented by the GaAs active layer 3 or the GaAs semiconductor substrate. However, because any influence of a crystal structure of the compound semiconductor is not exerted on the gate insulating layer (or the GaS layer), even though a compound semiconductor is made of InP, InGaAs or the like, the same effect as that obtained for the GaAs semiconductor can be obtained.

Also, the amorphous GaS layer 7 is formed by using the MBE apparatus. However, it is applicable that the amorphous GaS layer 7 be formed by the MOCVD method. In this case, because GaS is crystallized when the substrate temperature is about 400° C. or more, an allowable substrate temperature range in which the amorphous GaS layer 7 is formed is narrowed.

In addition, the source of the amorphous GaS layer 7 is not limited to "((t-Bu)GaS)$_4$". For example, "2((t-Bu)$_2$Ga ($\mu$-SH))$_2$" can be used as the source of the amorphous GaS layer 7.

Second Embodiment

In an experiment performed by inventors of this application, when a GaS film having a Ga-S composition ratio of 1:1 is directly deposited on a GaAs substrate by using the MBE apparatus in which the tertiary-butylgallium-sulfide-cubane "((t-Bu)GaS)$_4$" is sputtered to obtain GaS used as a material of the GaS film, a density of interface levels placed between the GaS film and the GaAs substrate can be reduced to $5 \times 10^{10}$ eV$^{-1}$cm$^{-2}$. However, the reduction of the interface level density is not sufficient. Therefore, in cases where carriers accumulated in an interface area between the GaS film and the GaAs substrate are used as conduction particles, there is a probability that the carriers are undesirably scattered because of the trapping of the carriers in the interface states and the roughness of the surface of the interface area. To avoid the above drawback, in this embodiment, an MISFET is provided because the scattering of the carriers based on the interface states is reduced in the MISFET as compared with a case that the GaS film is directly deposited on the GaAs substrate.

Figure 10:
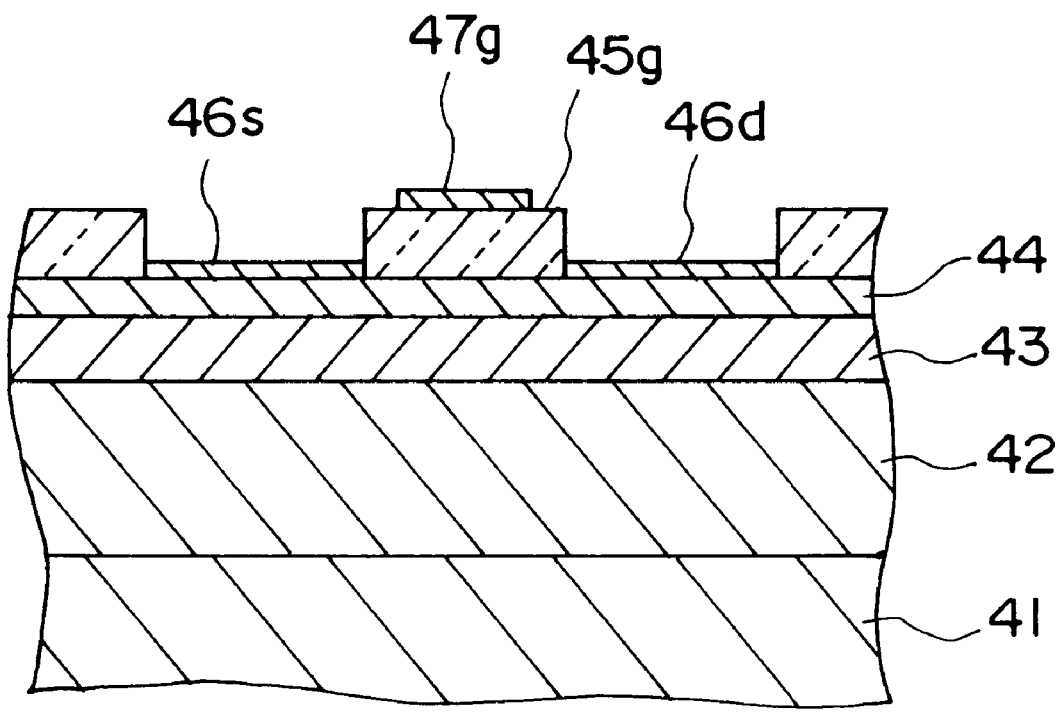
FIG. 10 is a cross sectional view of an MISFET according to the second embodiment.

FIG. 10 is a cross sectional view of an MISFET according to the second embodiment.

As shown in FIG. 10, a buffer layer 42 of Al$_{0.3}$Ga$_{0.7}$As having a thickness of 500 nm, a channel layer 43 of n-type GaAs, in which Si is doped and the thickness is 100 nm, and a wide gap layer 44 of Al$_{0.3}$Ga$_{0.7}$As having a thickness of 5 nm are arranged on a surface of a GaAs substrate 41 in that order. An impurity (Si) concentration in the channel layer 43 is, for example, $5 \times 10^{16}$ cm$^{-3}$.

Also, a gate insulating film 45g of GaS having a thickness of 30 nm is arranged on a surface portion of the wide gap layer 44, and a source electrode 46s and a drain electrode 46d respectively having a two-layer structure of AuGe (a lower layer) and Au (an upper layer) are arranged on both sides of the gate insulating film 45g. An alloying processing is performed at lower regions of the source electrode 46s and the drain electrode 46d, so that the source electrode 46s and the drain electrode 46d are respectively connected with the channel layer 43 in ohmic contact. In addition, a gate electrode 47g of Al is arranged on the gate insulating film 45g.

Figure 11:
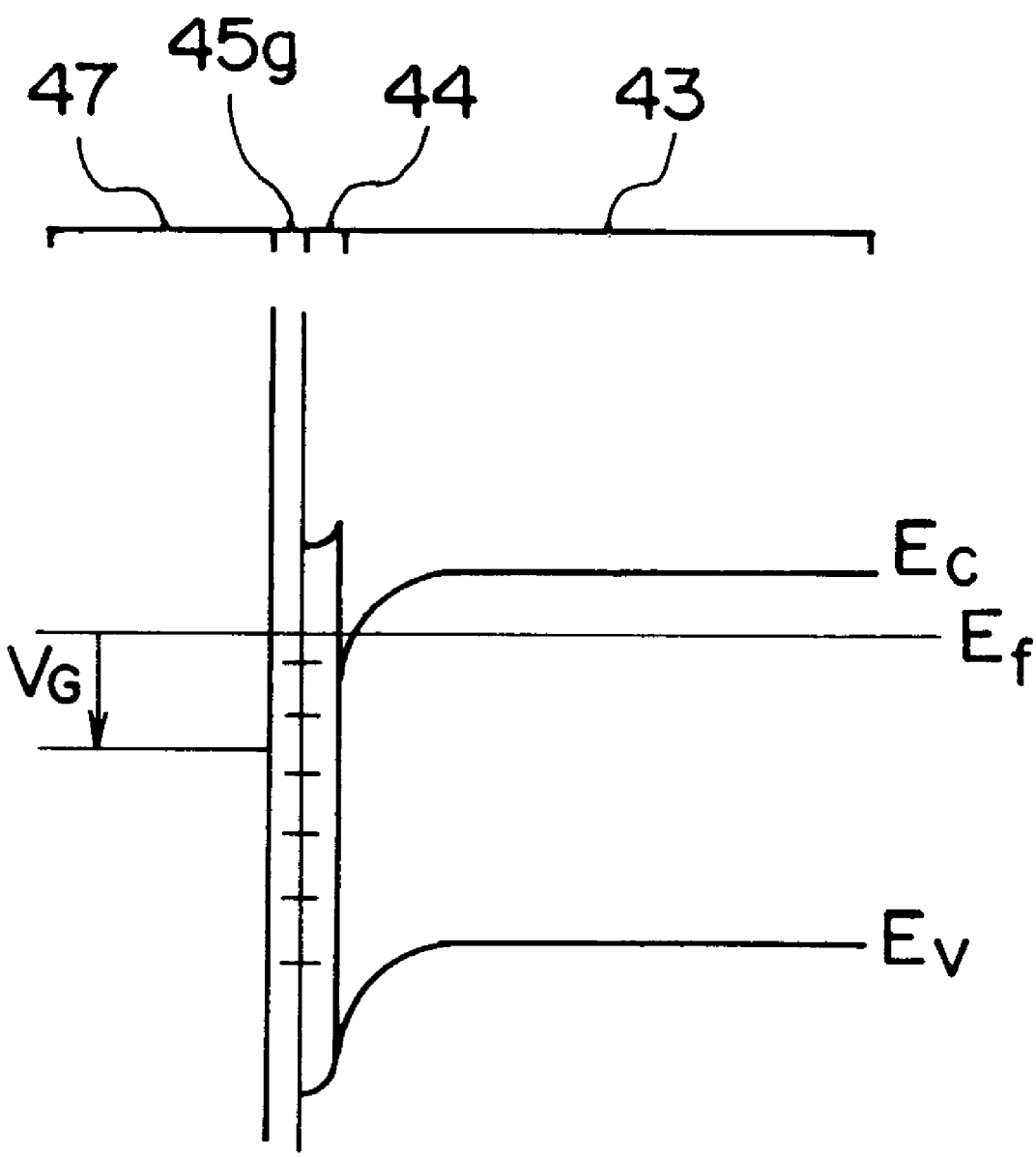
FIG. 11 shows an energy band in an MIS structure portion of the MISFET shown in FIG. 10.

FIG. 11 shows an energy band in an MIS structure portion of the MISFET shown in FIG. 10. A solid line Ec indicates an energy level at a lower edge of a conduction band, a solid line Ev indicates an energy level at an upper edge of a valence band, and a solid line Ef indicates a Fermi level. The wide gap layer 44 of Al$_{0.3}$Ga$_{0.7}$As has an energy band gap larger than that of the channel layer 43, and the gate insulating film 45g of GaS has an energy band gap larger than that of the wide gap layer 44.

In cases where GaAs directly contacts with GaS, interface states are formed in an interface area between GaAs and GaS. In Contrast, in this embodiment, the wide gap layer 44 of AlGaAs is arranged between the channel layer 43 of GaAs and the gate insulating film 45g of GaS, so that interface states are hardly formed in an interface area between GaAs and AlGaAs.

When a positive voltage V$_G$ is applied to the gate electrode 47g, the conduction band edge Ec and the valence band edge Ev are respectively curved in the neighborhood of an edge portion of the channel layer 43 facing the side of the wide gap layer 44. Therefore, an electron accumulating layer is formed in the neighborhood of the interface between the channel layer 43 and the wide gap layer 44, and the source electrode 46s and the drain electrode 46d shown in FIG. 10 are electrically connected with each other through the electron accumulating layer.

In this case, because interface states hardly exist in an interface area between the channel layer 43 of GaAs and the wide gap layer 44 of AlGaAs, the scattering of carriers based on the trapping of the carriers at the interface states can be considerably reduced. Also, because the surface of the interface area is made smooth, the scattering of the carriers caused by the roughness of the surface of the interface area can be considerably reduced. Therefore, the MISFET can be operated at a high speed.

In contrast, interface states exist in an interface area between the wide gap layer 44 and the gate insulating film 45g. Therefore, it is preferred that the MISFET have the configuration in which interface states placed between the wide gap layer 44 and the gate insulating film 45g do not interfere with a wave function of particular carriers leaking out into the wide gap layer 44 among the carriers accumulated in the interface area between the channel layer 43 and the wide gap layer 44. Anyway, in cases where the wide gap layer 44 has a thickness of one atom layer or more, an effect obtained by arranging the wide gap layer 44 between the channel layer 43 and the gate insulating film 45g can be expected. Also, to sufficiently control the carrier concentration in the channel layer 43 according to the voltage applied to the gate electrode 47g, it is preferred that the thickness of the wide gap layer 44 be set to 20 nm or less.

Next, a manufacturing method of the MISFET shown in FIG. 10 is described with reference to FIGS. 12(A) to 12(E).

Figure 12A:
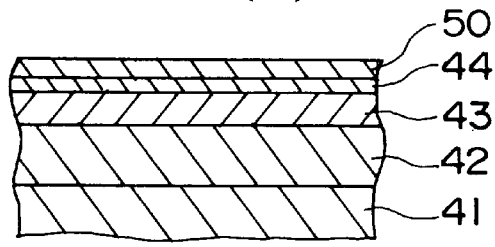
FIGS. 12(A) to 12 (E) are cross section views showing a series of manufacturing steps of the MISFET manufacturing method.

As shown in FIG. 12(A), the buffer layer 42 of $Al_{0.3}Ga_{0.7}As$ having a thickness of 500 nm, the channel layer 43 of n-type GaAs in which Si is doped and the thickness is 100 nm, the wide gap layer 44 of $Al_{0.3}Ga_{0.7}As$ having a thickness of 5 nm and a cap layer 50 of non-doped GaAs having a thickness of 10 nm are deposited on a surface of the GaAs substrate 41 in that order according to a molecular beam epitaxy (MBE). The cap layer 50 is deposited to prevent the oxidation of the AlGaAs wide gap layer 44.

As materials of the buffer layer 42, the channel layer 43, the wide gap layer 44 and the cap layer 50, a Ga metal, an Al metal and an As metal are used. The deposition of each layer is performed under operating conditions that a substrate temperature is set to about 580° C., a V/III ratio is set to 10, a growing speed of GaAs is set to 1 μm per hour (μm/h) and a growing speed of AlGaAs is set to 1.3 μm/h. Here, the V/III ratio denotes a composition ratio of a V-group element to a III-group element.

Figure 12D:
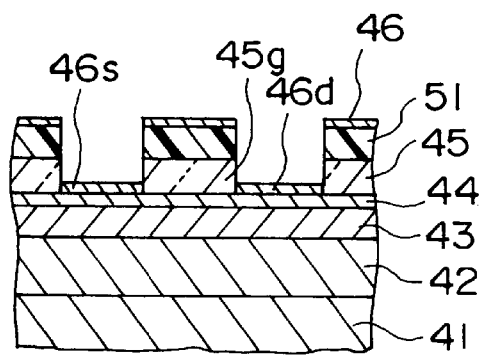
Figure 12B:
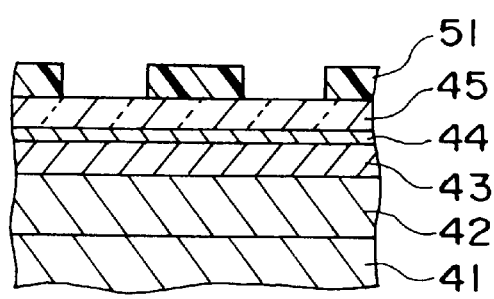

Thereafter, as shown in FIG. 12(B), the cap layer 50 shown in FIG. 12(A) is removed, and a GaS film 45 is deposited on the wide gap layer 44.

Figure 13:
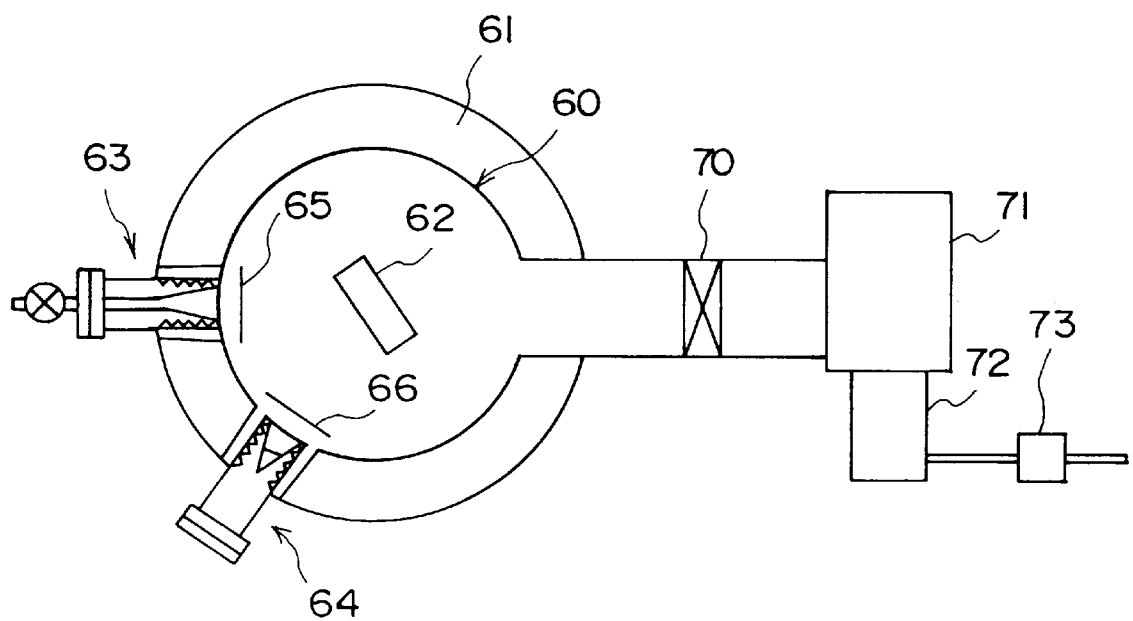
FIG. 13 is a schematic view of an MBE apparatus used for the deposition of the GaS film.

FIG. 13 is a schematic view of an MBE apparatus used for the deposition of the GaS film 45. As shown in FIG. 13, a vacuum chamber 60 is surrounded by a liquid nitrogen shroud 61, and a substrate mounting element 62 is arranged in the vacuum chamber 60. Gas existing in the vacuum chamber 60 is exhausted by a diffusion pump 72 and a rotary pump 73 through a gate valve 70 and a liquid nitrogen trap 71, and the vacuum chamber 60 is set to a vacuum condition. The substrate mounting element 62 has a heating mechanism and a rotating mechanism, so that a substrate mounted on the substrate mounting element 62 can be heated and rotated.

A gas cell 63 and a K cell 64 are attached on a wall of the vacuum chamber 60. ((T-Bu)GaS)$_4$ used to obtain a GaS material is put in a pyrolytic boron crucible (PBN) of the K cell 64, and tris dimethyl amino arsine (TDMMAs) gas or hydrogen chloride (HCl) gas is supplied from the gas cell 63 to the vacuum chamber 60. Also, a shutter 65 is arranged in an opening portion of the gas cell 63, and a shutter 66 is arranged in an opening portion of the K cell 64.

The substrate shown in FIG. 12(A) is mounted on the substrate mounting element 62 of the MBE apparatus shown in FIG. 13. Thereafter, gas of the vacuum chamber 60 is vacuum-exhausted to about $1 \times 10^{-6}$ Pa, and the substrate temperature is set to 500° C. Thereafter, the tris dimethyl amino arsine gas is jetted out from the gas cell 63 into the vacuum chamber 60 at a flow rate of 0.5 sccm for 15 minutes. Therefore, a surface oxide film formed on a substrate surface is removed.

Thereafter, HCl gas is jetted out from the gas cell 63 into the vacuum chamber 60, and the cap layer 50 arranged as the most upper layer of the substrate is etched and removed. Therefore, the surface of the AlGaAs wide gap layer 44 is exposed. Thereafter, the jetting of the HCl gas is stopped, the substrate temperature is lowered to 400° C., the shutter 66 is opened, and the GaS film 45 having a thickness of 30 nm is deposited on the wide gap layer 44 on condition that the substrate temperature is maintained at a temperature of about 400° C.

Thereafter, a patterned resist 51 having openings for a source region and a drain region is formed on the GaS film 45. Thereafter, as shown in FIG. 12(C), the GaS film 45 is etched while using the patterned resist 51 as a mask, so that the gate insulating film 45g made of GaS remains under the patterned resist 51 placed between the openings. In this case, a wet etching, in which hydrogen chloride is used as an etchant, is performed for the etching of the GaS film 45.

Thereafter, as shown in FIG. 12(D), a laminated film 46 made of AuGe/Au is deposited on the entire surface of the substrate according to a vacuum deposition. go Thereafter, the patterned resist 51 is removed to lift off the AuGe/Au laminated film 46 deposited on the patterned resist 51 from the substrate, so that the source electrode 46s and the drain electrode 46d remain in positions corresponding to the source region and the drain region. Thereafter, an alloying processing is performed for lower regions of the source electrode 46s and the drain electrode 46d at a temperature of 350° C. for 5 minutes, so that the source electrode 46s and the drain electrode 46d are respectively connected with the channel layer 43 in ohmic contact.

Figure 12E:
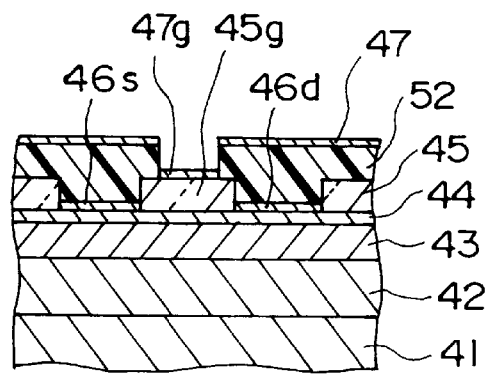
Figure 12C:
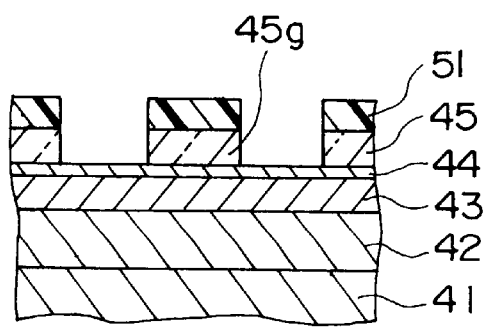

Thereafter, as shown in FIG. 12(E), a patterned resist 52 having an opening, from which a portion of the surface of the gate insulating film 45g is exposed, is formed. Thereafter, a vacuum deposition is performed to deposit an Al film on the entire surface of the substrate. Thereafter, a lift off method is performed to remove a portion of the Al film placed on the patterned resist 52, so that the gate electrode 47g remains. Therefore, the MISFET shown in FIG. 10 is obtained.

In the above embodiment, GaAs is used as the material of the channel layer 43, and AlGaAs is used as the material of the wide gap layer 44. However, it is applicable that other compound semiconductors be used as the materials of the layers 43 and 44 on condition that an energy band gap in the wide gap layer 44 is larger than that in the channel layer 43. In more detail, in cases where electrons are used as carriers, the conduction band edge Ec of the wide gap layer 44 is set to be higher than the conduction band edge Ec of the channel layer 43. In contrast, in cases where positive holes are used as carriers, the valence band edge Ev of the wide gap layer 44 is set to be lower than the valence band edge Ev of the channel layer 43. For example, it is applicable that the channel layer 43 be made of GaAs, InAs or InGaAs and the wide gap layer 44 be made of AlGaAs, InGaP, InAlP, InGaAlAs, InGaAlP, InGaAsP or InGaAlAsP.

Also, in this embodiment, the channel layer 43 is made of the n-type semiconductor. However, it is applicable that the channel layer 43 be made of a p-type semiconductor. For example, it is applicable that the channel layer 43 be made of a p-type GaAs in which Zn is doped.

Third Embodiment

A manufacturing method of a compound semiconductor apparatus according to a third embodiment of the present invention is described with reference to FIGS. 14(A) to 14(H). In the third embodiment, a manufacturing method of an MISFET is described as an example. However, a manufacturing method according to the present invention can be applied for any compound semiconductor apparatus.

Figure 14A:
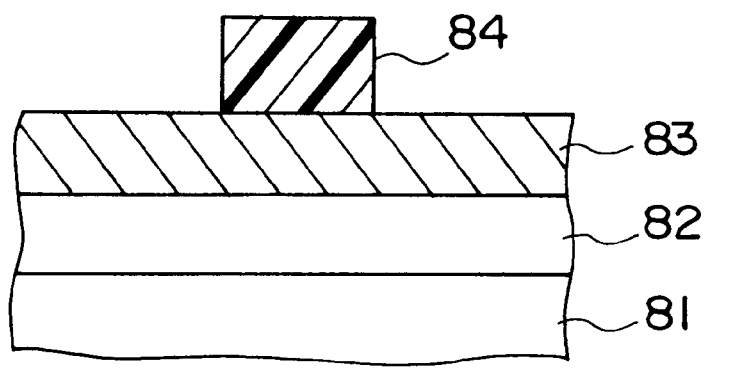
FIGS. 14(A) to 14(H) are cross section views showing a series of manufacturing steps of the third embodiment.

As shown in FIG. 14(A), undoped $Al_{0.3}Ga_{0.7}As$ is deposited on a main surface of a GaAs substrate 81 having a semi-insulating property to form a buffer layer 82 at a thickness of 500 nm. Thereafter, p-type GaAs including Be at a Be concentration of $1\times10^{16}$ cm$^{-3}$ is deposited on the buffer layer 82 to form a channel layer 83. In this case, a molecular beam epitaxy (MBE) is performed to deposit the AlGaAs buffer layer 82 and the GaAs channel layer 83, and a Ga metal, an Al metal and an As metal are used as materials of AlGaAs and GaAs. Also, the deposition of each layer is performed under operating conditions that a substrate temperature is set to about 580° C., a V/III ratio is set to 10, a growing speed of GaAs is set to 1 $\mu$m/h and a growing speed of AlGaAs is set to 1.3 $\mu$m/h.

After the deposition of the channel layer 83, a patterned resist 84 having a thickness of about 1 $\mu$m is formed on a surface of the channel layer 83 to cover a channel region of the MISFET with the patterned resist 84. A width of the patterned resist 84 is, for example, 2 $\mu$m.

Figure 14B:
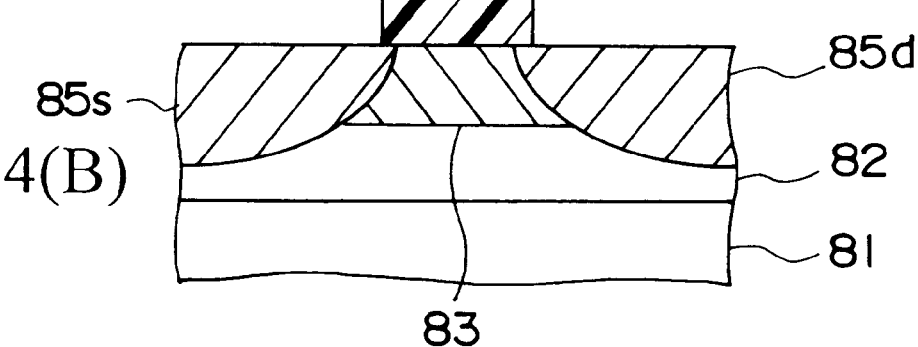

Thereafter, as shown in FIG. 14(B), Si ions are injected into upper portions of the channel layer 83 and the buffer layer 82 while using the patterned resist 84 as a mask. In this ion injection, an acceleration voltage is set to 60 keV, and a dose amount is set to $5\times10^{13}$ cm$^{-2}$. Therefore, Si injection regions 85s and 85d are formed on both sides of the patterned resist 84 among the upper portions of the channel layer 83 and the buffer layer 82 in this ion injection. After the ion injection, the patterned resist 84 is removed.

Figure 14C:
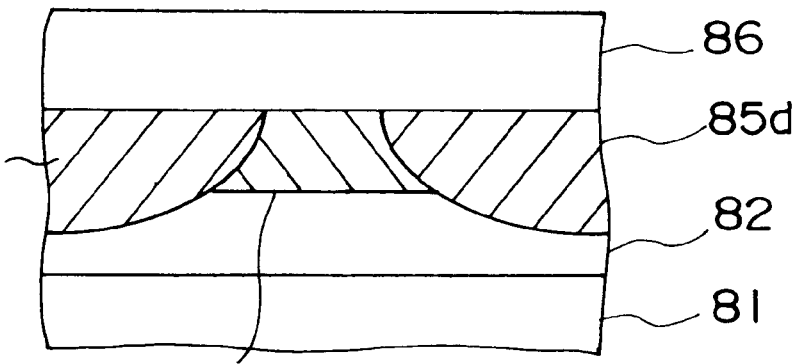

Thereafter, as shown in FIG. 14(C), a GaAs substrate 86 is put on the surface of the substrate, and a rapid thermal annealing processing is performed at a temperature of 850° C. for about 15 seconds. In this thermal processing, Si injected in a step shown in FIG. 14(B) is activated, an n-type source region 85s and an n-type drain region 85d are formed. In this case, the GaAs substrate 86 is put on the substrate to prevent As from being released from the GaAs channel layer 83 and the like.

Figure 14D:
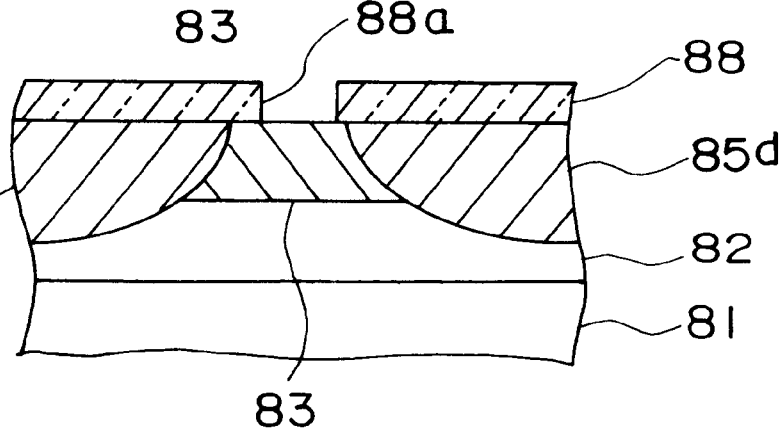

Thereafter, as shown in FIG. 14(D), an $SiO_2$ film 88 having a thickness of 50 nm is deposited on the entire surface of the substrate, the $SiO_2$ film 88 is patterned, and an opening 88a is formed on the channel region between the source region 85s and the drain region 85d. In this case, a width of the opening 88a is, for example, set to 1 $\mu$m. The width of the opening 88a is equivalent to a gate length.

After the formation of the opening 88a, the substrate is put in the MBE apparatus, and a surface of the channel layer 83 exposed to a bottom surface of the opening 88a is cleaned. In detail, the substrate shown in FIG. 14(D) is mounted on the substrate mounting element 62 of the MBE apparatus shown in FIG. 13. Thereafter, gas of the vacuum chamber 60 is vacuum-exhausted to about $1\times10^{-6}$ Pa, and the substrate temperature is set to 500° C. Thereafter, the tris dimethyl amino arsine gas is jetted out from the gas cell 63 into the vacuum chamber 60 at a flow rate of 0.5 sccm for 15 minutes. Therefore, a surface oxide film formed on the substrate surface is removed.

Figure 14E:
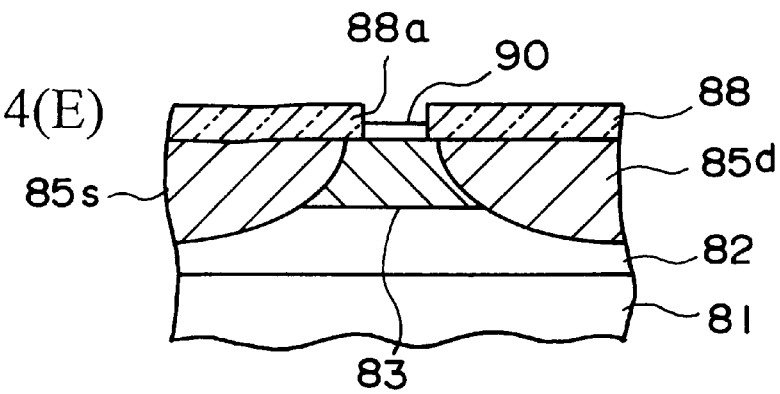

Thereafter, as shown in FIG. 14(E), a GaS film 90 having a thickness of about 30 nm is deposited on the bottom surface of the opening 88a by using the MBE apparatus shown in FIG. 13. In this case, the deposition of the GaS film 90 is performed under operating conditions that the temperature of the K cell 64 in which $((t-Bu)GaS)_4$ is, for example, put is set to 100° C., the substrate temperature is set to 420° C. and the pressure of the vacuum chamber 60 is set in a range from $1\times10^{-6}$ to $1\times10^{-7}$ Torr. In these operating conditions, any amorphous GaS film is not grown on the $SiO_2$ film 88, but an amorphous GaS film 90 is selectively grown on the surface of the GaAs channel layer 83 exposed to the bottom surface of the opening 88a.

In this case, when various growing experiments are performed while changing the growing speed or the like depending on the substrate temperature, the pressure of the vacuum chamber 60 and the temperature of the K cell 64, an optimum selective growing condition can be found out from various growing conditions. The inventors of this application find out that the pressure of $2\times10^{-4}$ Torr or less is preferred. In contrast, a selective growing of the amorphous GaS film 90 is difficult under an operating condition of organometallic chemical vapor deposition (MOCVD) in which the growing of a film is performed at a pressure of about $1\times10^{-3}$ Torr.

Figure 14F:
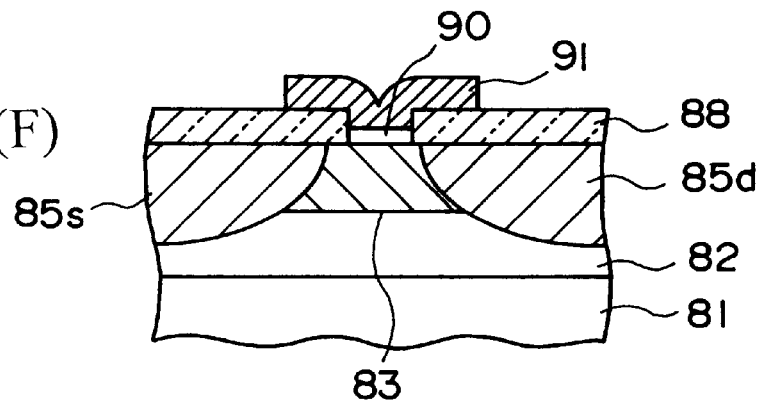

Also, it is preferred that a growing temperature be set in a range from 350 to 500° C. In these operating conditions, the GaS film 90 in which a composition ratio of Ga to S is 1:1 can be selectively grown. Thereafter, as shown in FIG. 14(F), a gate electrode 91 made of WSi is formed on the upper surface of the GaS film 90 and a surface of the $SiO_2$ film 88 placed in the neighborhood of the GaS film 90. In this case, a sputtering operation is performed to deposit the WSi film and form the gate electrode 91 under operating conditions that a WSi material is used as a target, Ar is used as a sputtering gas, the substrate temperature is set to a room temperature and the pressure is set to $1\times10^{-2}$ Torr. Also, a dry etching operation, in which a mixed gas of $CF_4$ and $O_2$ is used as an etching gas, is performed for the patterning of the WSi film.

Figure 14G:
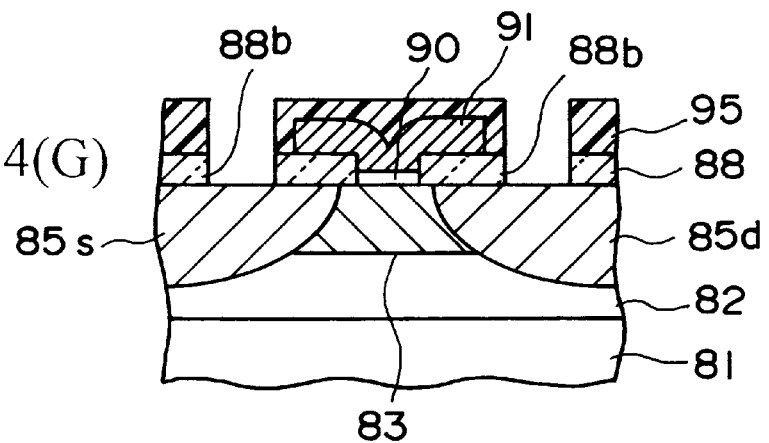

Thereafter, as shown in FIG. 14(G), a resist film 95 is coated on the surface of the substrate, and openings of the resist film 95 are formed at positions corresponding to the source region 85s and the drain region 85d. Thereafter, the $SiO_2$ film 88 is etched while using the resist film 95 as a mask, and portions of the surfaces of the source region 85s and the drain region 85d are exposed to form openings 88b.

Thereafter, laminated layers of an AuGe alloy layer and an Au layer are deposited on the upper surface of the resist film 95 and the bottom surfaces of the openings 88b according to a vacuum evaporation. Thereafter, the resist film 95 is removed, and the AuGe/Au layer deposited on the resist film 95 is lifted off.

Figure 14H:
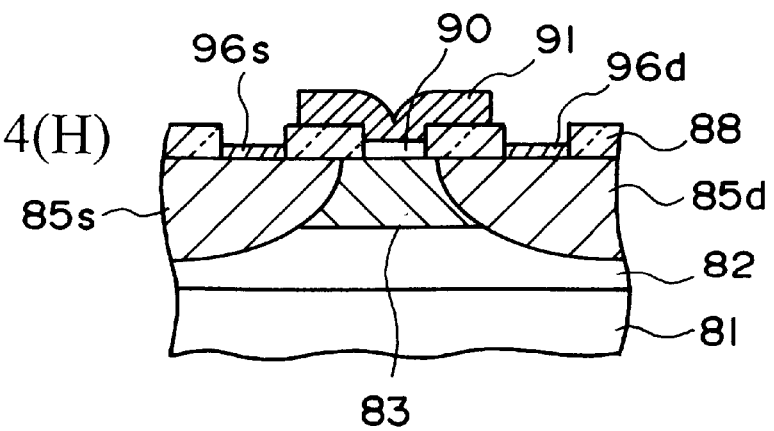

Therefore, as shown in FIG. 14(H), a source electrode 96s and a drain electrode 96d are formed on the surfaces of the source region 85s and the drain region 85d. Thereafter, an alloying processing is performed for lower regions of the source electrode 96s and the drain electrode 96d at a temperature of about 350° C. Therefore, the source electrode 96s is connected with the source region 85s in ohmic contact, and the drain electrode 96d is connected with the drain region 86d in ohmic contact.

Accordingly, because the GaS film 90 formed on the GaAs channel layer 83 functions as a gate insulating film, the MISFET in which the number of interface states is low can be obtained.

Also, in this embodiment, the source region 85s and the drain region 85d are formed in the steps shown in FIGS. 14(B) and 14(C) before the GaS film 90 is deposited in the step shown in FIG. 14(E). In general, to form a source region and a drain region, a high temperature thermal processing is required for the diffusion or activation of impurities in the source region and the drain region. Therefore, assuming that a thermal processing is performed at a temperature of 550° C. or more after the deposition of the GaS film 90, there are drawbacks that a crystal structure of the GaS film 90 is changed, S atoms in the GaS film 90 are released and S atoms in the GaS film 90 are diffused into the GaAs channel layer 83. However, in this embodiment, because a high temperature thermal processing is performed before the deposition of the GaS film 90, the above drawbacks can be avoided.

Also, in this embodiment, as shown in FIG. 14(H), the gate electrode 91 is extended from a region placed on the upper surface of the GaS film 90 to regions which are placed on the upper surface of the $SiO_2$ film 88 arranged on both sides of the GaS film 90, so that the gate electrode 91 is formed in a T shape in a cross sectional view. Accordingly, because the gate electrode 91 is formed in the T cross sectional shape, even though a gate length of the gate electrode 91 is shortened, the resistance of the gate electrode 91 can be reduced. In particular, in cases where the gate length is shortened to about 0.1 μm, the resistance of the gate electrode 91 can be considerably reduced.

Even though both side portions of a GaS insulating film placed under a gate electrode are etched after the formation of the gate electrode having a wide width, a gate length can be shortened, and the resistance of the gate electrode can be reduced. However, in this manufacturing method, it is difficult to process the gate electrode with a high accuracy according to the side-etching. Also, the gate electrode is easily damaged after the side-etching.

In contrast, in this embodiment, because the gate length of the gate electrode 91 is determined according to a size of the opening 88a formed in the step shown in FIG. 14(D), the accuracy of the gate length can be heightened. Also, because the gate electrode 91 tightly contacts with the $SiO_2$ film 88, there is no probability that the gate electrode 91 is damaged.

In this embodiment, when the GaS film 90 is selectively grown, the $SiO_2$ film 88 is used as a mask film. However, this embodiment is not limited to $SiO_2$, but it is preferred that oxide, nitride or nitride-oxide of a III-group, a IV-group or a V-group be used as the mask film. For example, SION, SiN, GaN, AlGaN, AlN, GaO, GaAs oxide, GaP oxide or InP oxide can be used as the mask film.

In this embodiment, the GaS film 90 is used as the gate insulating film of the MISFET. The selective growing of a GaS film can be applicable for the manufacturing of another compound semiconductor apparatus.

Also, the material of the substrate 81 is not limited to GaAs, but it is preferred that the substrate 81 be made of another III-V groups compound semiconductor material. For example, InP, InGaAs, AlGaAs or the like can be used as the material of the substrate 81.

Having illustrated and described the principles of the present invention in preferred embodiments thereof, it should be readily apparent to those skilled in the art that the invention can be modified in arrangement and detail without departing from such principles.

What is claimed is;:

1. A metal-insulator semiconductor field effect transistor, comprising:

a compound semiconductor layer;

a source electrode arranged on the compound semiconductor layer;

a drain electrode arranged on the compound semiconductor layer to be separated from the source electrode;

a gate insulating layer made of amorphous gallium-sulfide (GaS) which is placed between the source electrode and the drain electrode and is arranged on the compound semiconductor layer; and a gate electrode arranged on the gate insulating layer.

2. A metal-insulator semiconductor field effect transistor according to claim 1 in which a composition ratio of gallium to sulfur in the gate insulating layer is 1:1.

3. A compound semiconductor apparatus, comprising:

a holding substrate;

a channel layer which is made of a compound semiconductor and is arranged on a surface of the holding substrate;

a wide gap layer which is made of another compound semiconductor having a band gap larger than that of the channel layer and is arranged on the channel layer;

a gate insulating film which is made of amorphous GaS and is arranged on a portion of the wide gap layer; and a gate electrode, arranged on the gate insulating film, for positioning a source region and a drain region in portions of the channel region placed on both sides of the gate electrode.

4. A compound semiconductor apparatus according to claim 3 in which the channel layer is made of a material selected from the group consisting of GaAs, InAs and InGaAs, and the wide gap layer is made of a material selected from the group consisting of AlGaAs, InGaP, InAlP, InGaAlAs, InGaAlP, InGaAsP and InGaAlAsP.

5. A compound semiconductor apparatus according to claim 3 in which a thickness of the wide gap layer ranges from a thickness corresponding to one atom of the wide gap layer to 20 nm.

6. A compound semiconductor apparatus comprising:

a substrate of which a surface layer is made of a III-V groups compound semiconductor material;

a pair of insulating films arranged on portions of the surface layer of the substrate placed on both sides of the channel region;

a gate insulating film which is made of amorphous GaS and is arranged on the channel region placed between the insulating films, both ends of the gate insulating film tightly contacting with ends of the insulating films;

a gate electrode arranged on the gate insulating film; and a pair of electrodes connected in ohmic contact with the surface layer of the substrate on both sides of the channel region.

7. A compound semiconductor apparatus according to claim 6 in which the gate insulating film is made of GaS in which a composition ratio of Ga to S is 1:1.

8. A compound semiconductor apparatus according to claim 6 in which the gate electrode extends from a region placed on an upper surface of the gate insulating film to regions which are placed on upper portions of the inulating films placed on both sides of the gate insulating film.

* * * * *